(12) United States Patent
Sheafor

(10) Patent No.: US 9,939,839 B2
(45) Date of Patent: Apr. 10, 2018

(54) LOW POWER AUTOMATIC CALIBRATION METHOD FOR HIGH FREQUENCY OSCILLATORS

(71) Applicant: Ambiq Micro, Inc., Austin, TX (US)

(72) Inventor: Stephen James Sheafor, Boulder, CO (US)

(73) Assignee: Ambiq Micro, Inc., Austin, TX (US)

( * ) Notice: Subject to any disclaimer, the term of this patent is extended or adjusted under 35 U.S.C. 154(b) by 0 days.

(21) Appl. No.: 14/879,863

(22) Filed: Oct. 9, 2015

(65) Prior Publication Data

US 2016/0112052 A1    Apr. 21, 2016

Related U.S. Application Data

(60) Provisional application No. 62/066,218, filed on Oct. 20, 2014.

(51) Int. Cl.
| | | |
|---|---|---|
| G06F 1/06 | (2006.01) | |
| H03L 7/06 | (2006.01) | |
| H03L 7/181 | (2006.01) | |
| H03L 7/18 | (2006.01) | |
| G06F 1/12 | (2006.01) | |
| G06F 11/30 | (2006.01) | |
| G06F 11/34 | (2006.01) | |
| G06F 13/10 | (2006.01) | |
| G01R 19/00 | (2006.01) | |
| G05F 1/56 | (2006.01) | |
| H03K 17/687 | (2006.01) | |
| H03M 1/12 | (2006.01) | |
| H03L 7/00 | (2006.01) | |
| G06F 1/32 | (2006.01) | |

(52) U.S. Cl.
CPC ........... *G06F 1/06* (2013.01); *G01R 19/0084* (2013.01); *G05F 1/56* (2013.01); *G06F 1/12* (2013.01); *G06F 1/3237* (2013.01); *G06F 1/3287* (2013.01); *G06F 11/3041* (2013.01); *G06F 11/3414* (2013.01); *G06F 13/102* (2013.01); *H03K 17/687* (2013.01); *H03L 7/00* (2013.01); *H03L 7/06* (2013.01); *H03L 7/18* (2013.01); *H03L 7/181* (2013.01); *H03M 1/12* (2013.01); *Y02B 60/1221* (2013.01); *Y02B 60/1282* (2013.01); *Y02D 10/128* (2018.01)

(58) Field of Classification Search
CPC .............. H03L 7/06; H03L 7/181; H03L 7/18
USPC ...................................... 331/14, 18, 1 R, 1 A
See application file for complete search history.

(56) References Cited

U.S. PATENT DOCUMENTS

| | | | | |
|---|---|---|---|---|
| 6,181,209 B1 * | 1/2001 | Tsai | .................. | H03L 7/089 327/159 |
| 8,000,428 B2 * | 8/2011 | Staszewski | ............. | H03L 7/085 375/362 |
| 8,179,111 B2 * | 5/2012 | Akyildiz | .................. | G06F 1/26 323/283 |
| 2012/0229308 A1 * | 9/2012 | Tsai | .................. | H04L 27/04 341/22 |

* cited by examiner

*Primary Examiner* — Ryan Johnson
(74) *Attorney, Agent, or Firm* — Hunt Pennington Kumar & Dula, PLLC; Artie Pennington; Jeffrey Van Myers

(57) ABSTRACT

A clock calibrator for use in an electronic system comprising an integrated circuit such as a microcontroller. The clock calibrator embodies a frequency adjustment facility adapted dynamically to adjust the frequency of one or more high-frequency clock generators as a function of a lower-frequency reference clock.

12 Claims, 3 Drawing Sheets

US 9,939,839 B2

LOW POWER AUTOMATIC CALIBRATION METHOD FOR HIGH FREQUENCY OSCILLATORS

CROSS REFERENCE TO RELATED APPLICATIONS

This application is related to the following:
1. Provisional Application Ser. No. 62/066,218, filed 20 Oct. 2014 ("Parent Provisional");
2. PCT Application No. PCT/US15/50239 filed 15 Sep. 2015 ("Related Application 1"); and
3. U.S. application Ser. No. 14/855,105, filed 15 Sep. 2015 ("Related Application 2").

This application claims priority to the Parent Provisional, and hereby claims benefit of the filing date thereof pursuant to 37 CFR § 1.78(a)(4).

The subject matter of the Parent Provisional and the Related Applications, each in its entirety, is expressly incorporated herein by reference.

BACKGROUND OF THE INVENTION

1. Field of the Invention

The present invention relates to a method and apparatus for calibrating a high frequency oscillator.

2. Description of the Related Art

In general, in the descriptions that follow, the first occurrence of each special term of art that should be familiar to those skilled in the art of integrated circuits ("ICs") and systems will be italicized. In addition, when a term that may be new or that may be used in a context that may be new, that term will be set forth in bold and at least one appropriate definition for that term will be provided. In addition, throughout this description, the terms assert and negate may be used when referring to the rendering of a signal, signal flag, status bit, or similar apparatus into its logically true or logically false state, respectively, and the term toggle to indicate the logical inversion of a signal from one logical state to the other. Alternatively, the mutually exclusive boolean states may be referred to as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Hereinafter, reference to a facility shall mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities of each system. Depending on the intended system application, the several facilities comprising the hardware platform may be integrated onto a single IC, or distributed across multiple ICs. Depending on cost and other known considerations, the electronic components, including the facility-instantiating IC(s), may be embodied in one or more single- or multi-chip packages. However, unless expressly stated to the contrary, the form of instantiation of any facility shall be considered as being purely a matter of design choice.

Shown in FIG. 1 is a typical general purpose computer system 10. Although not all of the electronic components illustrated in FIG. 1 may be operable in the sub-threshold or near-threshold domains in any particular embodiment, some, at least, may be advantageously adapted to do so, with concommitant reductions in system power dissipation. In particular, in recently-developed battery-powered mobile systems, such as smart-phones and the like, many of the discrete components typical of desktop or laptop devices illustrated in FIG. 1 are integrated into a single integrated circuit chip. The Related Application 1 discloses several circuits adapted to operate in the sub-threshold domain.

Shown by way of example in FIG. 2 is a typical single-chip microcontroller unit ("MCU") 12 comprising: a central processing unit ("CPU") 14; at least one random-access memory ("RAM") facility 16; at least one Flash memory ("Flash") facility 18; one or more timers ("Timers") 20; at least one input/output master ("I/O Master") facility 22; at least one input/output slave ("I/O Slave") facility 24; at least one analog to digital converter ("ADC") facility 26; a power management unit ("PMU") 28; and a clock generator ("Clock Generator") facility 30. A system bus ("System Bus") 32 interconnects the several MCU facilities 14-30, and a clock distribution bus ("Clock Bus") 34 distributes all clock signals developed by the Clock Generator 30 to the respective clocked facilities. As is known, development of the several clocks is generally controlled by information written to one or more control registers within Clock Generator 30 via the System Bus 32, and by system power state information typically provided by the PMU 28.

It is known to calibrate a high frequency oscillator using a phase locked loop ("PLL") operating at a lower frequency. However, as is also known, a PLL continuously consumes a non-trivial amount of power while in operation. While it is possible to selectively enable the PLL only when needed, the output tends to be relatively unstable for a period of time after the PLL is enabled. As a result, there is a tendency to leave PLLs enabled continuously, with concommitant power dissipation. What is needed is a method and apparatus adapted selectively to calibrate a high frequency clock while consuming less power than known prior art.

BRIEF SUMMARY OF THE INVENTION

In one embodiment, a clock calibration method is provided that develops a first control signal as a function of temperature, and responds to the first control signal, by first: in response to a second control signal, selectively enabling a reference clock oscillator to develop reference clock pulses at a selected reference frequency; and second, in response to a third control signal, selectively enabling a measured clock oscillator to develop measured clock pulses at a frequency determined as a function of an adjustment value. Then, in response to a first one of the reference clock pulses, the method initiates counting of the measured clock pulses, and, in response to a second reference clock pulse, terminates counting of the measured clock pulses. Finally, the method adjusts the adjustment value as a function of a difference between the count of the measured clock pulses and a selected target value.

In one other embodiment, a clock calibration method is provided that develops a first control signal as a function of temperature, and responds to the first control signal, by first: in response to a second control signal, selectively enabling a reference clock oscillator to develop reference clock pulses at a selected reference frequency; and second, in response to a third control signal, selectively enabling a measured clock oscillator to develop measured clock pulses at a frequency determined as a function of an adjustment value. Then, in response to a selected one of the reference clock pulses, the method adjusts the adjustment value as a function of a difference between the frequency of the measured clock relative to the frequency of the reference clock.

In yet another embodiment, a clock calibration method is provided that that develops a first control signal as a function of temperature, and responds to the first control signal, by selectively enabling a reference clock oscillator to develop reference clock pulses at a selected reference frequency. Then, in response to a second control signal, the method selectively enables a measured clock oscillator to develop measured clock pulses at a frequency determined as a function of an adjustment value. Finally, the method responds to a selected one of the reference clock pulses, by adjusting the adjustment value as a function of a difference between the frequency of the measured clock relative to the frequency of the reference clock.

In one further embodiment, a clock calibration facility is adapted to perform any one of the clock calibration methods.

In yet further embodiment, an electronic system comprising a clock calibration facility is adapted to perform any one of the clock calibration methods.

In a still further embodiment, a computer readable medium is provided including executable instructions which, when executed in a processing system, causes the processing system to perform any one of the clock calibration methods.

BRIEF DESCRIPTION OF THE SEVERAL VIEWS OF THE DRAWINGS

The several embodiments may be more fully understood by a description of certain preferred embodiments in conjunction with the attached drawings in which.

Figure 1:
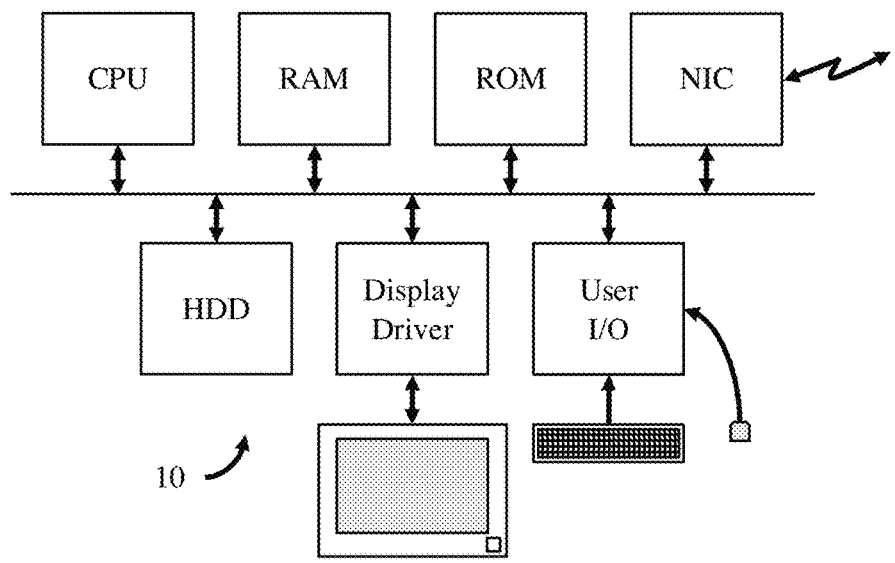
FIG. 1 illustrates, in block diagram form, a general purpose computer system adapted to instantiate any of the several embodiments.

In the drawings, similar elements will be similarly numbered whenever possible. However, this practice is simply for convenience of reference and to avoid unnecessary proliferation of numbers, and is not intended to imply or suggest that identity is required in either function or structure in the several embodiments.

DETAILED DESCRIPTION OF THE INVENTION

Figure 3:
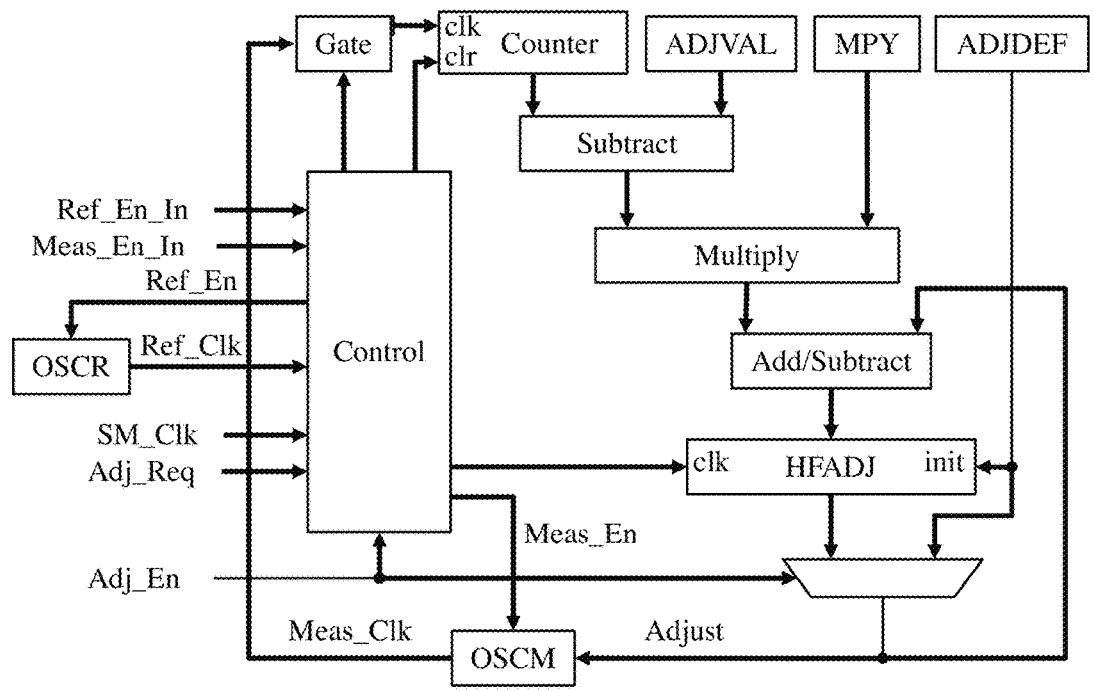
FIG. 3 illustrates, in block diagram form, one embodiment of a clock calibrator.

Shown in FIG. 3 is one embodiment of a clock calibrator 36 adapted to effectively and efficiently solve all of the above issues discussed above with respect to the known prior art clock calibrators. In accordance with this embodiment, a clock to be adjusted, Meas_Clk, is developed by a resistor-capacitor ("RC") oscillator OSCM, whose frequency is controlled by an Adjust value in a monotonic fashion. A reference clock, Ref_Clk, is developed by a high accuracy crystal oscillator, OSCR, adapted to oscillate at a crystal specific frequency which may be at a lower frequency than OSCM. In general, the frequency adjustment process is controlled by a Control clocked by a control clock SM_Clk, selected to be either Ref_Clk, Meas_Clk or be developed by a third oscillator (not shown). In the illustrated embodiment, Control is instantiated as a finite state machine.

Figure 4:
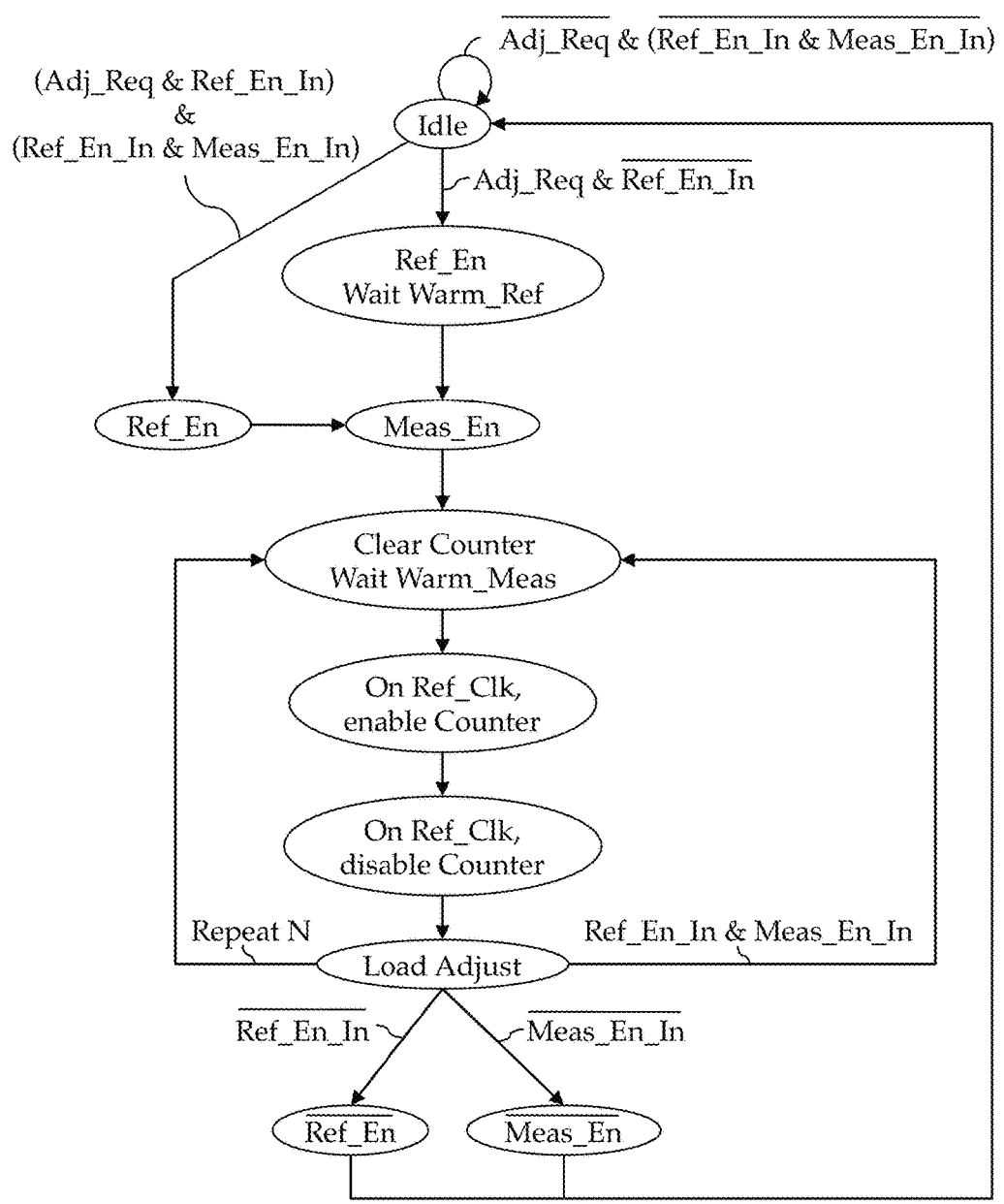
FIG. 4 illustrates, in state flow diagram form, one embodiment of my clock calibration method.

In accordance with one embodiment, illustrated generally in FIG. 4, the frequency adjustment process comprises the following steps:

[1] Wait for the rising edge of an externally-developed control signal Adj_Req;

[2] If OSCR is not already enabled, i.e., a externally-developed control signal Ref_En_In is negated, locally assert a control signal Ref_En to enable OSCR;

[3] Wait a period Warm_Ref until the output of OSCR is stable—for a typical crystal oscillator, Warm_Ref will be of the order of 1-2 seconds;

[4] If OSCM is not enabled, i.e., the externally-developed control signal Meas_En_In is not asserted, locally assert a control signal Meas_En to enable OSCM;

[5] Clear a Counter, then wait a period Warm_Meas until the output of OSCM is stable—for a typical RC oscillator, Warm_Meas will be of the order of a few 10 s of µs;

[6] On the next rising edge of Ref_Clk, initiate Meas_Clk to clock the Counter;

[7] On the next rising edge of Ref_Clk, disable Meas_Clk from clocking the Counter;

[8] Generate Adjust by:
  subtracting the Counter value from a predefined target value, ADJVAL, optionally multiplying it by a predefined constant, MPY;
  if the frequency of OSCM increases as Adjust increases, adding the result to the current Adjust value; or
  if the frequency of OSCM decreases as Adjust increases, subtracting the result from the current Adjustment value; and
  loading the result into a HFADJ register;

[9] Repeat steps [5] to [8] RPT times if desired to improve accuracy; and

[10] If the respective enable control signal is negated, disable OSCR and/or OSCM.

In one embodiment, the value ADJVAL is selected as a function of the frequency of Ref_Clk, $f_{REF}$, and the desired frequency of Meas_Clk, $f_{MEAS}$. At the end of the frequency adjustment process, the Counter will contain a value which is the number of Meas_Clk periods which occur within a single Ref_Clk period. Thus, the optimal value to be loaded into ADJVAL is given by the equation:

$$\text{ADJVAL} = f_{MEAS} \div f_{REF} \qquad [\text{Eq. 1}]$$

As an example, if OSCR is adapted to develop Ref_Clk at a frequency of 32.768 KHz, and the desired frequency of Meas_Clk is 24 MHz, the optimal value for ADJVAL is 24000/32.768=732.42, which may be rounded down to 732.

In one embodiment, the value of MPY is selected based on the relationship between a 1-bit change in the Adjust value and the resulting frequency change in OSCM. If a 1-bit change of Adjust produces an X percent change in the OSCM frequency $f_{MEAS}$, that same change will therefore produce an X percent change in the Counter value. As a direct result, the Counter value will change by X percent, i.e., Y bits (where Y may be a fraction). Thus the optimal value for MPY will be 1/Y. In a typical system the value of X and therefore Y will vary over temperature and voltage, so MPY may be selected as an average value. In the illustrated embodiment, MPY should be an integer multiplier for hardware simplicity, and, ideally, will be 1.

If hardware limitations prevent MPY from being exact, the value of RPT can be increased so that several iterations of the frequency adjustment process are executed. In general, each iteration will tend to reduce the difference between the targeted OSCM frequency and the actual frequency, and a few iterations will generally take little additional power.

As noted above, the state machine clock can be either Ref_Clk or Meas_Clk, but, unless those oscillators would be running for other reasons, this may result in a power penalty. A preferred embodiment might be to have SM_Clk developed by a very low power RC oscillator (not shown), since the accuracy of this clock is unimportant to the frequency adjustment process.

The frequency of Adj_Req, which is typically a division of SM_Clk, can be selected to allow a tradeoff between the power consumed by the frequency adjustment process and inaccuracy created by changes in $f_{MEAS}$ caused by temperature changes. For example, if the temperature changes slowly, the frequency adjustment process can be executed less frequently while still maintaining a particular maximum error of $f_{MEAS}$.

One possible extension of the frequency adjustment algorithm is that if Ref_En_In and Meas_En_In are both asserted, the frequency adjustment process is run continuously since there is an insignificant power penalty. This maintains an optimal accuracy for OSCM.

If the automatic adjustment function is not enabled (ADJEN is not asserted), e.g., during initial start-up, a default adjustment value, ADJDEF, may be selected as the Adjust value. This value may also be the initial value loaded into the HFADJ register, thus allowing a known functional value to be measured during manufacturing test.

In one other embodiment, Ref_Clk may be developed by an external high accuracy frequency source, for example in a manufacturing test environment. By using that clock and executing the frequency adjustment algorithm, the correct initial value ADJDEF can then be read from the HFADJ register and loaded into non-volatile memory (not shown) to provide a good initial Adjust value.

Figure 2:
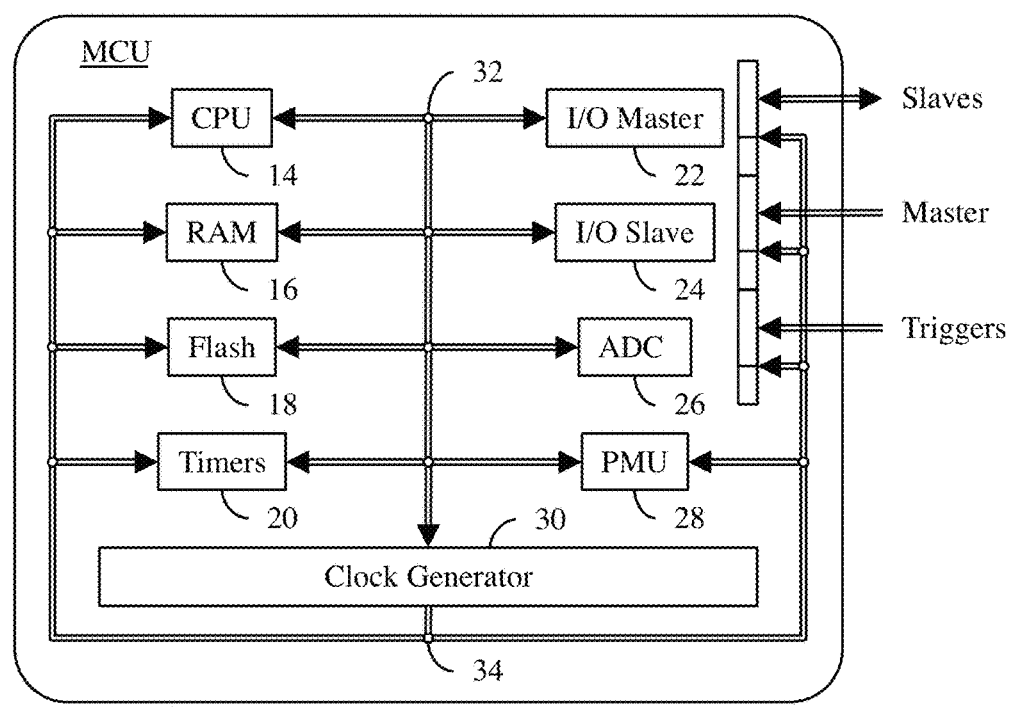
FIG. 2 illustrates, in block diagram form, a typical integrated system adapted to any of the several embodiments.

Although the operation of the frequency calibration algorithm has been described as implemented in the hardware embodiment illustrated in FIG. 3, the frequency adjustment algorithm may be performed equally well in software executing on the CPU (see, FIG. 2). One disadvantage of using a CPU, however, is that it requires a significant amount of power while running, and the frequency adjustment algorithm should be performed periodically even when the processor otherwise be inactive. If the CPU is asleep, it is often important that the frequency be reasonably close to correct without a delay, which also makes the CPU implementation problematic. On the other hand, one advantage of a software approach is that the frequency adjustment algorithm can be optimized, and other factors such as temperature can be included in the calibration process. For example, the value of MPY could be varied as a function of temperature.

Although described in the context of particular embodiments, one of ordinary skill in this art will readily realize that many modifications may be made in such embodiments to adapt either to specific implementations.

Thus it is apparent that an improved method and apparatus for calibrating a high frequency clock has been disclosed. Further, this method and apparatus provides performance generally superior to the best prior art techniques.

What is claimed is:

1. A clock calibration method comprising the steps of:
   [0] developing a first control signal as a function of temperature;
   [1] in response to the first control signal:
      [1.1] in response to a second control signal, selectively enabling a reference clock oscillator to develop reference clock pulses at a selected reference frequency; and
      [1.2] in response to a third control signal, selectively enabling a measured clock oscillator to develop measured clock pulses at a frequency determined as a function of an adjustment value;
   [2] in response to a first one of the reference clock pulses, initiating counting of the measured clock pulses;
   [3] in response to a second reference clock pulse, terminating counting of the measured clock pulses; and
   [4] adjusting the adjustment value as a function of a difference between the count of the measured clock pulses and a selected target value.

2. The method of claim 1 further comprising the step of:
   [5] selectively repeating steps [2] through [4].

3. The method of claim 1 further comprising the steps of:
   [6] in response to the second control signal, selectively disabling the reference clock oscillator; and
   [7] in response to the third control signal, selectively disabling the measured clock oscillator.

4. A clock calibration method comprising the steps of:
   [0] developing a first control signal as a function of temperature;
   [1] in response to the first control signal:
      [1.1] in response to a second control signal, selectively enabling a reference clock oscillator to develop reference clock pulses at a selected reference frequency; and
      [1.2] in response to a third control signal, selectively enabling a measured clock oscillator to develop measured clock pulses at a frequency determined as a function of an adjustment value; and
   [2] in response to a selected one of the reference clock pulses, adjusting the adjustment value as a function of a difference between the frequency of the measured clock relative to the frequency of the reference clock.

5. The method of claim 4 further comprising the step of:
   [3] selectively repeating step [2].

6. The method of claim 4 further comprising the steps of:
   [4] in response to the second control signal, selectively disabling the reference clock oscillator; and
   [5] in response to the third control signal, selectively disabling the measured clock oscillator.

7. A clock calibration method comprising the steps of:
   [0] developing a first control signal as a function of temperature;
   [1] in response to the first control signal, selectively enabling a reference clock oscillator to develop reference clock pulses at a selected reference frequency;
   [2] in response to a second control signal, selectively enabling a measured clock oscillator to develop measured clock pulses at a frequency determined as a function of an adjustment value;
   [3] in response to a first one of the reference clock pulses, initiating counting of the measured clock pulses;
   [4] in response to a second reference clock pulse, terminating counting of the measured clock pulses;
   [5] adjusting the adjustment value as a function of a difference between the count of the measured clock pulses and a selected target value;

[6] selectively repeating steps [3] through [5];

[7] in response to the first control signal, selectively disabling the reference clock oscillator; and

[8] in response to the second control signal, selectively disabling the measured clock oscillator.

8. A clock calibration method comprising the steps of:

[0] developing a first control signal as a function of temperature;

[1] in response to the first control signal, selectively enabling a reference clock oscillator to develop reference clock pulses at a selected reference frequency;

[2] in response to a second control signal, selectively enabling a measured clock oscillator to develop measured clock pulses at a frequency determined as a function of an adjustment value; and

[3] in response to a selected one of the reference clock pulses, adjusting the adjustment value as a function of a difference between the frequency of the measured clock relative to the frequency of the reference clock.

9. The method of claim 7 further comprising the step of:

[4] selectively repeating step [3].

10. The method of claim 7 further comprising the steps of:

[5] in response to the second control signal, selectively disabling the reference clock oscillator; and

[6] in response to the third control signal, selectively disabling the measured clock oscillator.

11. A clock calibration facility configured to perform the method of any preceding claim.

12. An electronic system comprising a clock calibration facility according to claim 11.

\* \* \* \* \*